(12) United States Patent
Harvey et al.

(10) Patent No.: US 6,249,039 B1
(45) Date of Patent: Jun. 19, 2001

(54) INTEGRATED INDUCTIVE COMPONENTS AND METHOD OF FABRICATING SUCH COMPONENTS

(75) Inventors: Ian Robert Harvey, Kaysville; Michael Frederick Ehman, North Ogden; Malcolm Randall Harvey, Hyde Park; James Craig Stephenson, Sandy, all of UT (US)

(73) Assignee: Bourns, Inc.

( * ) Notice: Subject to any disclaimer, the term of this patent is extended or adjusted under 35 U.S.C. 154(b) by 0 days.

(21) Appl. No.: 09/151,410

(22) Filed: Sep. 10, 1998

(51) Int. Cl.[7] .................................................. H01L 21/8222

(52) U.S. Cl. .................. 257/531; 257/528; 257/549; 438/329; 438/381

(58) Field of Search .................................... 257/531, 528, 257/549, 550; 438/381, 406, 421, 238, 171, 329

(56) References Cited

U.S. PATENT DOCUMENTS

| | | | |
|---|---|---|---|
| 3,290,758 | 12/1966 | Moyer | 29/155.5 |
| 3,614,544 | 10/1971 | Shield | 317/235 R |
| 3,881,244 | 5/1975 | Kendall | 29/602 |
| 3,898,595 | 8/1975 | Launt | 335/152 |
| 5,070,317 | 12/1991 | Bhagat | 336/200 |
| 5,336,921 | 8/1994 | Sundaram et al. | 257/531 |
| 5,425,167 | 6/1995 | Shiga et al. | 29/606 |
| 5,788,854 | 8/1998 | Desaigoudar et al. | 216/13 |
| 5,793,272 | * 8/1998 | Burghartz et al. | . |
| 6,015,742 | * 1/2000 | Ju | . |

FOREIGN PATENT DOCUMENTS

| | | | |
|---|---|---|---|
| 3036704 | 5/1982 | (DE) | H01F/21/06 |
| 57-111006 | 7/1982 | (JP) | H01F/15/00 |
| 97/16836 | 5/1997 | (WO) | H01F/19/04 |

OTHER PUBLICATIONS

Park et al., "High Current Integrated Microinductors and Microtransformers Using Low Temperature Fabrication Processes", *Microelectronics International*, vol. 14, No. 3 (Sep. 1997).

(List continued on next page.)

*Primary Examiner*—Kevin M. Picardat
*Assistant Examiner*—D. M. Collins
(74) *Attorney, Agent, or Firm*—Klein & Szekeres, LLP

(57) ABSTRACT

An inductive component includes a substrate on the surface of which is a lower insulation layer having a shallow concavity or trench, a first plurality of conductive elements formed in the trench, a magnetic core formed over the first plurality of conductive elements, and a second plurality of conductive elements formed over the core. The first and second pluralities of conductive elements are connected to each other so as to form an inductive coil around the core. First and second core insulation layers are disposed between the core and the first and second pluralities of conductive elements, respectively. The component is fabricated by a method in which it is built up in the trench using thin film techniques. A first array of conductors is patterned over the lower insulation layer, and a first core insulation layer is applied over the first conductor array. A magnetic core is formed on top of the first core insulation layer, and a second core insulation layer is applied over the core. A second array of conductors is patterned on top of the second core insulation layer so that the ends of the conductors in the first and second arrays contact each other to form an inductive coil around the core. The formation of either the first or second plurality of conductors may coincide with the formation of the metal conductor layer in the manufacture of a semiconductor integrated circuit, whereby the inductive component can be manufactured as part of the integrated circuit.

19 Claims, 6 Drawing Sheets

OTHER PUBLICATIONS

Ahn, "Micromachined Components as Integrated Inductors and Magnetic Microactuators", Chapter 2, Ph.D. Dissertation, Georgia Institute of Technology (May 1993).

Lochel et al., "Micro Coils Fabricated by UV Depth Lithography and Galvanoplating", *Proceedings of the 8th International Conference on Solid State Sensors and Actuators,* pp. 264–267 (Jun., 1995).

Yamada et al., "Fabrication of Wrapped Micro Coils Wound around a Magnetic Core", id. at pp. 272–275.

Watanabe et al., "A New Fabrication Process of a Planar Coil Using Photosensitive Polyimide and Electroplating", id. at pp. 268–271.

Ryu et al., "2D and 3D Simulation of Toroidal Type Thin Film Inductors", IEEE Transactions on Magnetics, Jul. 1998, vol. 34, No. 4, pp. 1360–1362.

"Process allows construction of 3–D coils: High Q inductor merges with CMOS", by Gail Robinson, Electronic Engineering Times Jan. 19, 1998, pp. 37 and 40, contributed by Chappell Brown.

* cited by examiner

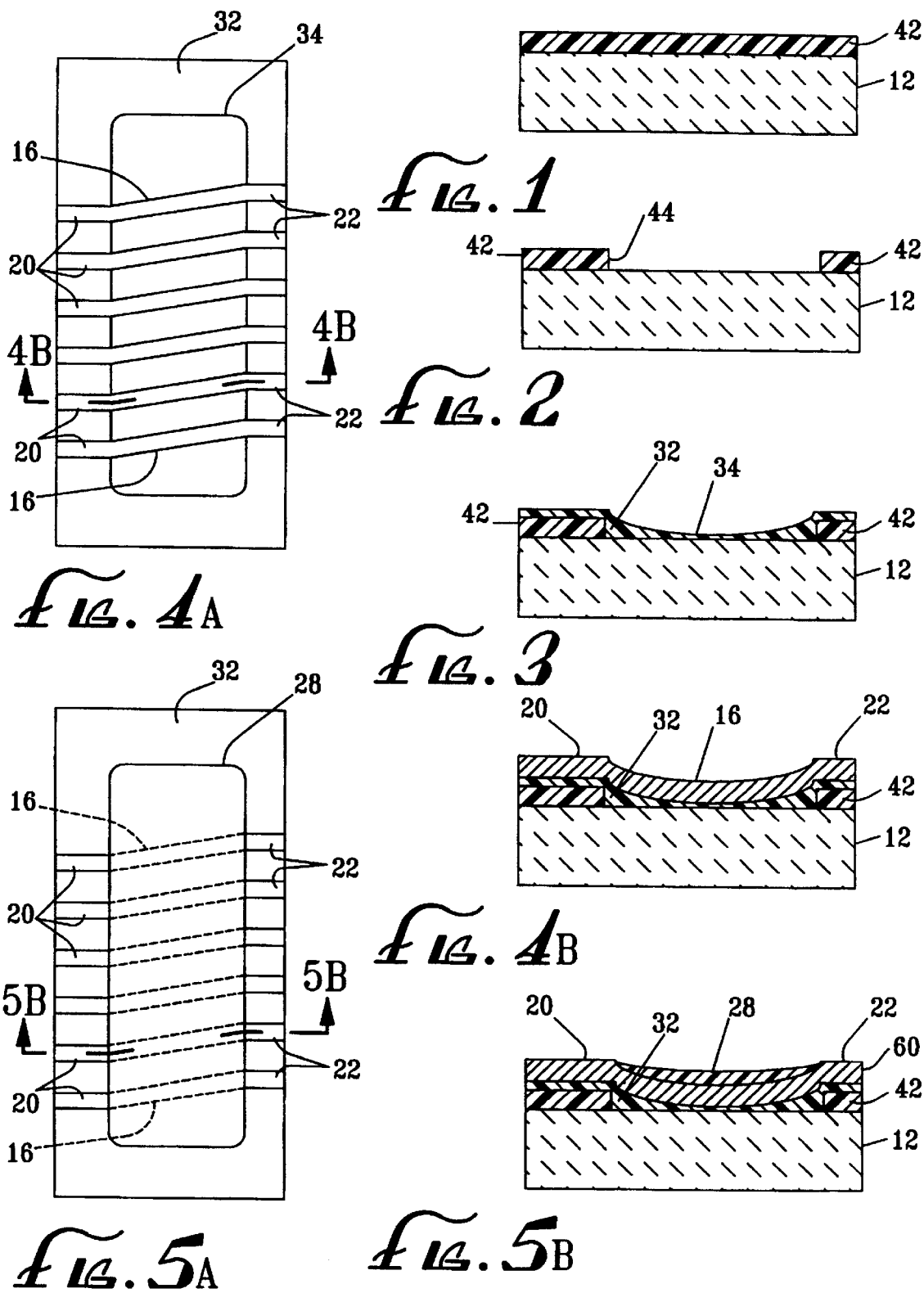

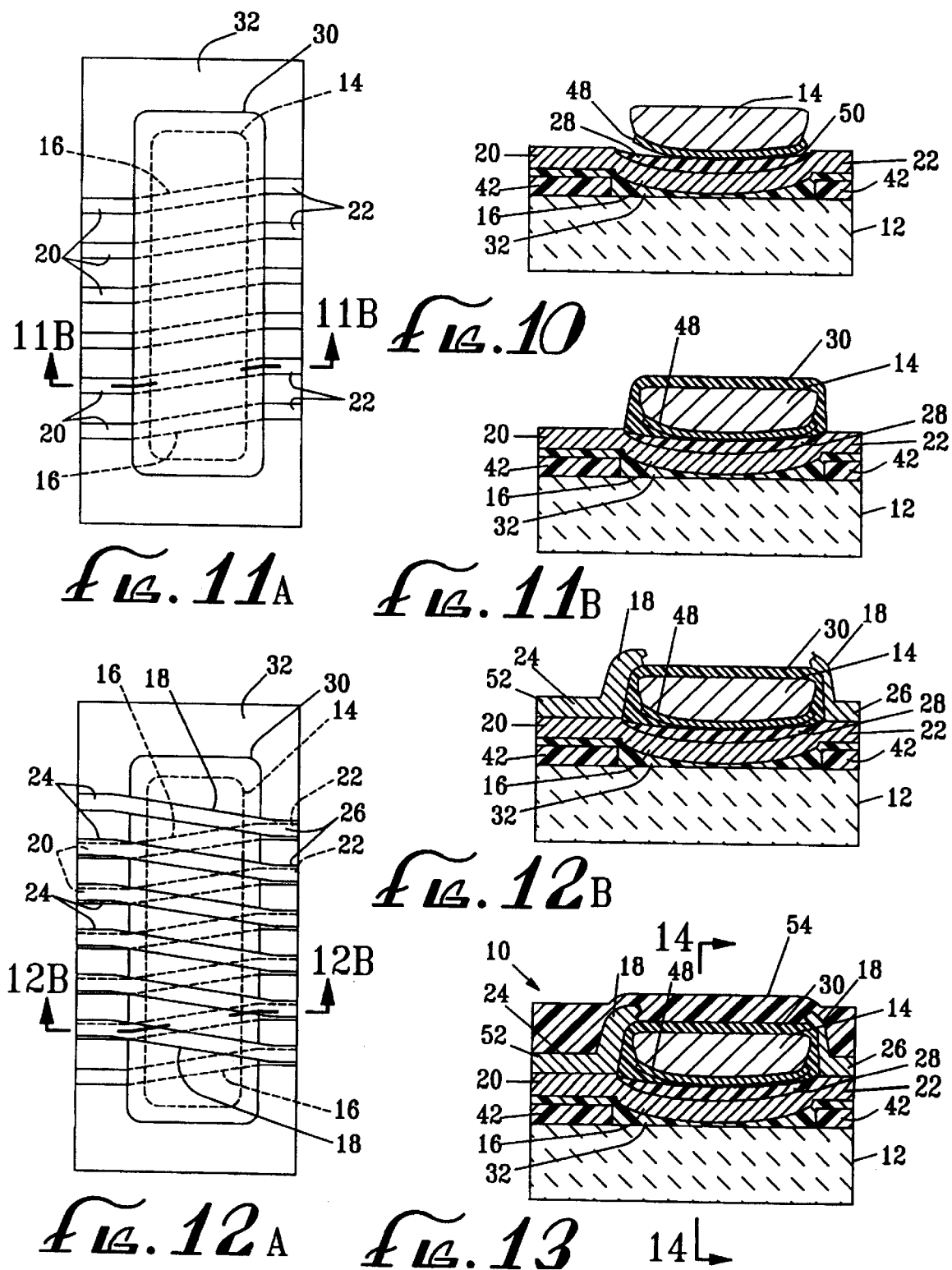

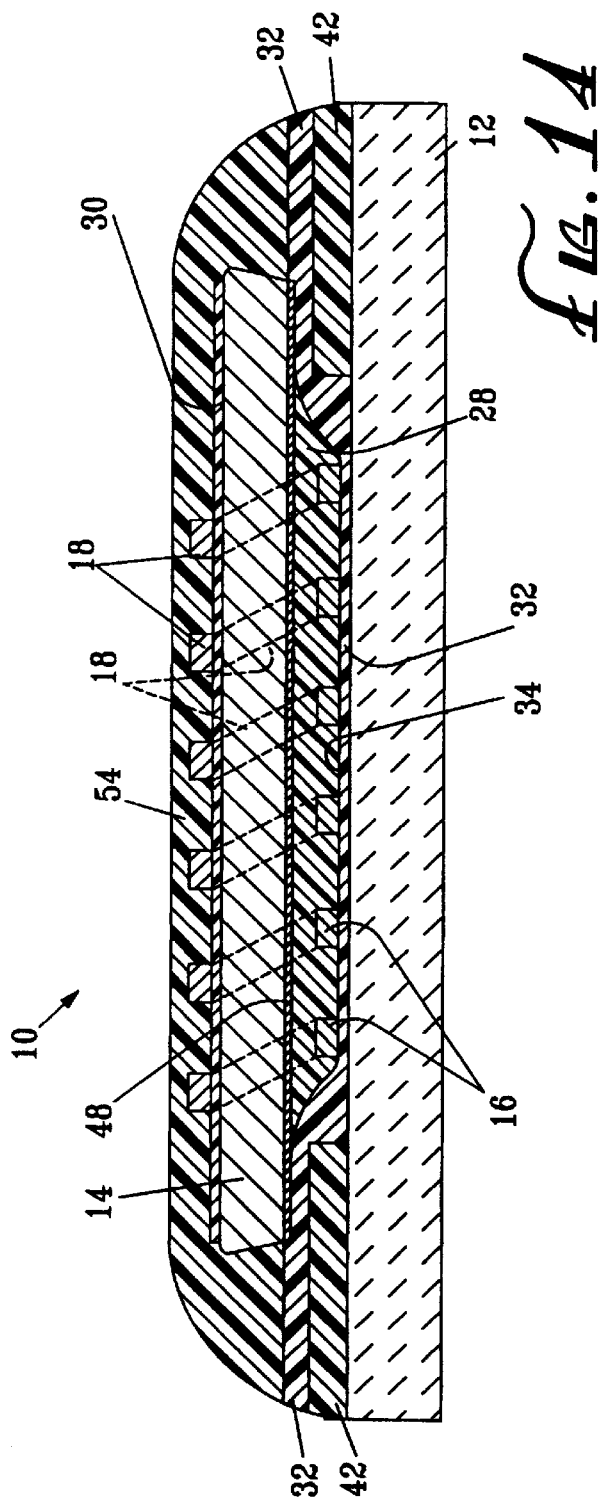
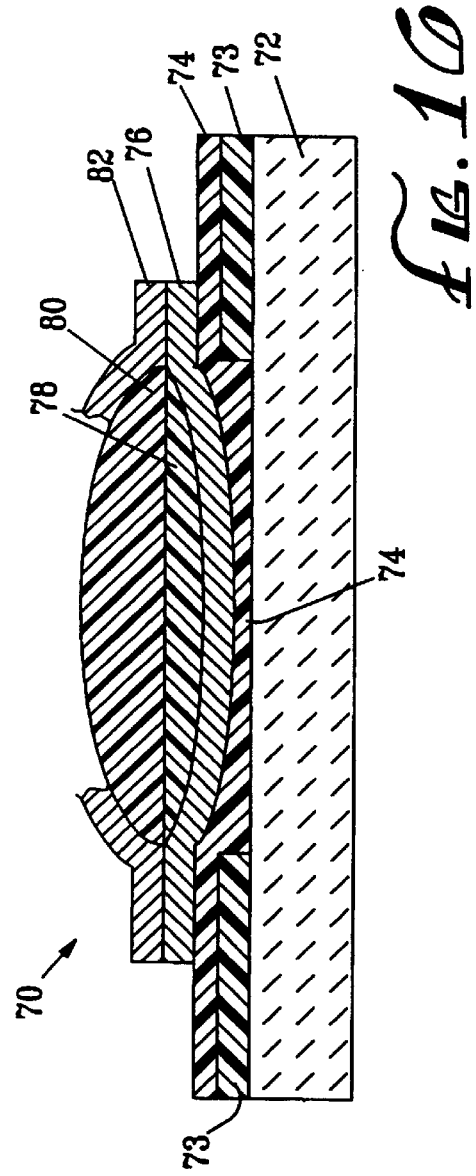

INTEGRATED INDUCTIVE COMPONENTS AND METHOD OF FABRICATING SUCH COMPONENTS

CROSS REFERENCE TO RELATED APPLICATIONS

Not Applicable

FEDERALLY SPONSORED RESEARCH OR DEVELOPMENT

Not Applicable

BACKGROUND OF THE INVENTION

The present invention pertains to inductive components for use with integrated circuit devices. In particular, the present invention pertains to inductive components formed using fabrication techniques similar to those used in the fabrication of integrated circuit devices.

An increasing number of products use electronic circuitry formed in integrated circuits. These integrated circuits may replace circuits formed of discrete components mounted on a board. In many circumstances, integrated circuits provide a variety of advantages over discrete components, such as smaller size, lower power consumption, faster performance, greater reliability, and lower placement and overall manufacturing costs.

The techniques for manufacturing integrated circuits, including the steps of laying down successive layers of material in particular patterns, are well-known in the semiconductor arts. For the most part, these integrated circuits have consisted of active components (principally transistors). More recently, a few types of passive components have been formed onto integrated circuits. However, these passive components have been largely limited to capacitors, resistors and a few types of inductive devices of low inductance, because of limitations imposed by conventional semiconductor manufacturing techniques.

The fabrication of high inductance inductive components by integrated circuit manufacturing techniques has presented significant technological challenges. One problem has been the cross-talk induced in buried active components by the fields created by overlying inductors. Another challenge has been the difficulty of forming a magnetic inductor core using batch semiconductor manufacturing processes.

Many types of electronic devices include a large number of inductive components. This is particularly true of radio frequency devices, such as radios and cellular telephones, which filter analog signals. To date, these products have had much of their circuitry formed in small integrated circuits, but have required large circuit boards to hold the discrete passive components, including resistors and capacitors, and particularly inductive components. Integrating the inductive components with the remainder of the electronic circuitry in integrated circuits would allow electronic devices to be much smaller than has previously been possible. Greater integration of the inductive components into the integrated circuits would provide more efficient utilization of space, lower power consumption, and would also provide greater reliability. Thus, there has been a long-felt need to integrate inductive components into integrated circuit devices.

Thus far, the techniques developed for integrating inductive components into integrated circuit devices have involved expensive processes that are not compatible with high volume mass production, or that have made significant trade-offs in terms of device performance and efficiency. For example, one technique for producing an inductive component on an integrated circuit device has been to form a planar inductive component comprising a single layer coil on the substrate. The size of such planar inductive components is limited, as is the number of turns that may be included, generally about 5 to 10 turns. The limitation on the number of turns in the coil limits the inductance and the quality factor ("Q") of the inductive component. Furthermore, such inductive components are generally limited to a maximum inductance of about 100 nanohenries. In addition, the magnetic flux lines of such an inductive component are primarily perpendicular to the plane of the integrated circuit device, forcing the magnetic fields into the substrate, resulting in possible cross-talk coupling with underlying devices, and possible energy losses due to interactions with the substrate itself.

Another problem in fabricating inductive components that may be included in integrated circuits is the need for relatively thick conductors that have consistent cross-sections, and consistent wire placement and spacing. These factors must be carefully controlled so that the inductive components may be repeatably manufactured.

In certain instances, thick film and micro-machining processes have been used to form inductive components as part of integrated circuits. See, for example, Park et al., "High Current Integrated Microinductors and Microtransformers Using Low Temperature Fabrication Processes", *Microelectronics International,* Vol. 14, No. 3 (September 1997); Ahn, "Micromachined Components as Integrated Inductors and Magnetic Microactuators", Chapter 2, Ph.D. Dissertation, Georgia Institute of Technology (May, 1993); Lochel et al., "Micro Coils Fabricated by UV Depth Lithography and Galvanoplating", *Proceedings of the 8th International Conference on Solid State Sensors and Actuators,* pp. 264–267 (June, 1995); Yamada et al., "Fabrication of Wrapped Micro Coils Wound around a Magnetic Core", id. at pp. 272–275; Watanabe et al., "A New Fabrication Process of a Planar Coil Using Photosensitive Polyimide and Electroplating", id. at pp. 268–271.

A thin film process for the fabrication of inductive coils is disclosed in U.S. Pat. No. 3,614,554. The metal layers formed by this process are necessarily quite thin in vertical cross-section, and thus current-carrying coils offer high resistances, while magnetic cores have high reluctances. The process requires the use of through-holes ("vias"), which increase the electrical resistance and thus power loss.

A batch fabrication process has recently been developed for forming an inductive component on a device containing an integrated circuit, using micromachining technology that is common to the semiconductor integrated circuit industry. The inductive component includes a substrate that forms a structural base. A lower set of spaced apart conductors is deposited and patterned on the substrate by conventional photolithographic and etching techniques. Deposition may be performed by means such as sputtering, electron beam evaporation, filament evaporation, or electrodeposition, depending on factors such as the type of metal used for the conductors. A lower insulation layer is deposited over the lower set of conductors so that the ends of the individual conductors are exposed. The lower insulation layer may be formed of polymeric insulating material, such as a thermoset polymer or thermoplastic. The lower insulation layer separates the lower conductors from a magnetic core element that is formed, by micro-molding technology, on a metallic seed layer (typically copper or gold) that is deposited on the lower insulation layer. An upper insulation layer is deposited over the magnetic core element and is also patterned to expose the ends of the lower conductors. This may be referred as a "via-less" architecture, since a separate patterning step is not required to create the vertical contact between layers. An upper set of spaced apart conductors is deposited on top of the second insulation layer so that the upper conductors contact the exposed ends of the lower conductors. The conductors of the upper and lower sets of conductors are interconnected to form one or more continuous coils around the core element. The entire structure may be encapsulated by a passivation layer for environmental protection.

The above-described inductive component may not be suitable, in certain applications, for construction on semiconductive substrates, such as doped silicon, due to electromagnetic coupling to the substrate or to nearby components and circuits. Furthermore, the via-less architecture creates a device with a relatively high vertical profile, thereby limiting the thickness of the magnetic core. Moreover, the magnetically induced currents in the substrate result in energy loss and quality factor ("Q") degradation.

SUMMARY OF THE INVENTION

The present invention is (a) a method of manufacturing an inductive component using batch processing manufacturing techniques typically used for the fabrication of integrated circuits, and (b) an inductive component manufactured by such a method. In particular, the inductive component of the present invention may be manufactured using thin film integrated circuit (IC) manufacturing techniques and materials chosen for optimum performance and ease of manufacture.

In accordance with the method of the present invention, a lower insulative layer, having a shallow, concave depression, or "trench", is formed on the surface of a substrate, and an inductive component is built up in the trench using thin film manufacturing technologies. The lower insulation layer isolates the inductive component from the substrate, both magnetically and electrically. A first array of conductors is patterned in the trench over the lower insulation layer, and a first core insulation layer is applied over the first conductor array. A magnetic core is formed on top of the first core insulation layer, over at least a portion of the first array of conductors, and a second core insulation layer is applied over the core. A second array of conductors is patterned on top of the second core insulation layer and over the core so that the ends of the conductors in the first array and the ends of the conductors in the second array contact each other to form a complete inductive coil around the core. Thus, the first and second arrays of conductors together form a complete inductor coil, with the first array forming a first or lower half of the coil, and the second array forming a second or upper half of the coil. No intermediate via patterning step or etching step is required.

An inductive component in accordance with the present invention includes a substrate on the surface of which is formed a lower insulation layer having a trench, a first plurality of conductive elements formed over the lower insulation layer, a magnetic core formed over the first plurality of conductive elements, and a second plurality of conductive elements formed over the core. Each of the second plurality of conductive elements is conductively connected to two of the first plurality of conductive elements, and vice versa, so as to form a continuous spiral or helical inductive coil around the core. Electrical isolation between the magnetic core and the first and second pluralities of conductive elements is respectively provided by first and second core insulation layers.

More specifically, the first and second pluralities of conductors are formed in arrays patterned using microlithographic techniques. Each conductor array is patterned by depositing a layer of photoresist, and exposing and developing the photoresist to form a pattern corresponding to the desired pattern of conductors. The exposed photoresist of the exposed pattern is removed. Plating techniques can be used to fill in the pattern created by the removed photoresist.

Alternatively, a metal coating can be applied over the photoresist and into the patterned openings formed where the photoresist has been removed. After the metal coating has been applied, the entire device is immersed in a photoresist stripper, which swells the photoresist. As the photoresist swells, the metal that overlies the photoresist is detached. The detached metal may then be rinsed away.

In accordance with a further aspect of present invention, the formation of either the first or second plurality of conductors may coincide with the formation of the metal conductor layer in the manufacture of a semiconductor integrated circuit. This aspect of the present invention allows the process of forming an inductor in accordance with the present invention to be combined with the manufacture of a semiconductor integrated circuit device.

In accordance with yet another aspect of the present invention, the formation of the magnetic core comprises the steps of applying a first photoresist layer over the surface of the first plurality of conductors, and forming a first opening in the first photoresist layer. A metal seed layer is then applied over the first photoresist layer, and a second photoresist layer is applied over the metal seed layer. A second opening is formed in the second photoresist layer to expose the seed layer, and the core is grown in the second opening from the exposed seed layer. The first and second photoresist layers are simultaneously stripped, and the seed layer that is not in contact with the resulting core is thereby physically removed. Alternatively, a single lithography step may be used if it is desired to chemically etch the seed layer.

A significant advantage of the present invention is the lower profile allowed for the inductive component, as compared with prior art thin film inductive components with via-less architectures, thereby allowing for a thicker magnetic core for any given vertical height above the substrate. In addition, the present invention allows the selection of materials for optimum performance, and the use of cost-efficient manufacturing techniques

BRIEF DESCRIPTION OF THE DRAWINGS

FIGS. 1, 2, and 3 are lateral cross-sectional views showing a method of fabricating an inductive component constructed in accordance with a first embodiment of the present invention, showing the first three major successive steps of the fabrication process for such a component;

FIG. 4A is a top plan view showing the fourth major step in the fabrication process;

FIG. 4B is a staggered lateral cross-sectional view taken along line 4B—4B of FIG. 4A;

FIG. 5A is a top plan view showing a fifth major step in the fabrication process;

FIG. 5B is a staggered lateral cross-sectional view taken along line 5B—5B of FIG. 5A;

FIGS. 6 through 10 are lateral cross-sectional views showing several further successive major steps in the fabrication process;

FIG. 11A is a top plan view showing a still further step in the fabrication process;

FIG. 11B is a staggered lateral cross-sectional view taken along line 11B—11B of FIG. 11A;

FIG. 12A is a top plan view showing a still further step in the fabrication process;

FIG. 12B is a staggered lateral cross-sectional view taken along line 12B—12B of FIG. 12A;

FIG. 13 is a staggered lateral cross-sectional view of an inductive component constructed in accordance with the first embodiment of the present invention;

FIG. 14 is a longitudinal cross-sectional view, taken along line 14—14 of FIG. 13;

FIG. 16 is a lateral cross-sectional view of a partially completed inductive component in accordance with a second embodiment of the present invention;

DETAILED DESCRIPTION OF THE PREFERRED EMBODIMENTS

The present invention is an inductive component, such as an inductor or a transformer, and a method of forming such an inductive component. The manufacturing method of the present invention uses techniques consistent with and commonly used in semiconductor IC manufacturing, and, in particular, so-called "back-end" processing techniques (e.g., metal isolation routing, and stacking). By using such semiconductor manufacturing techniques, in accordance with the present invention, one or more inductive components may be formed on the same device as a semiconductor integrated circuit using relatively inexpensive, repeatable batch processes. In particular, in accordance with the present invention, thin film manufacturing techniques may be used in the manufacture of inductive components.

An inductive component may be constructed in accordance with the present invention as part of an integrated circuit die, which itself is formed on a wafer, as is commonly done in the semiconductor manufacturing arts.

In accordance with the present invention, an inductive component is formed horizontally on the surface of a substrate. The component includes an elongate magnetic core. This core is surrounded by a helical or spiral conductive winding or coil. Each loop of the coil is formed by a first or lower half portion and a second or upper half portion, without a separate via processing sequence, but rather with direct connections between the two half portions. The lower half portion comprises a first array of substantially parallel linear lower conductive elements, and the upper half portion comprises a second array of substantially parallel linear upper conductive elements. A first end of each of the upper conductive elements is in contact with a first end of one of the lower conductive elements, and a second end of each of the upper conductive elements is in contact with a second end of a successive one of the lower conductive elements. Thus, the lower and upper half portions are in electrical contact so that a complete electrically conductive coil is formed around the core. Insulation material is placed between the core and the half portions that form the conductive coil. In addition, the coil and the core of the inductive component are electrically and magnetically isolated from the substrate.

Figure 15:
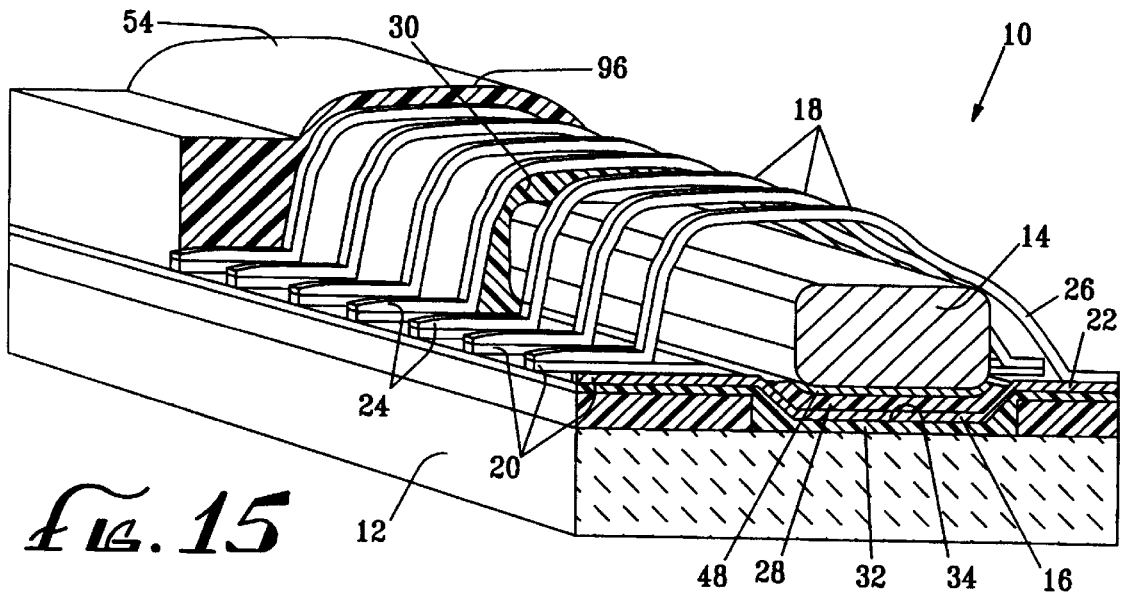
FIG. 15 is a perspective view, partially in cross-section, of a completed inductive component in accordance with the first embodiment of the present invention.

Referring first to FIGS. 13, 14, and 15, an inductive component 10, of a preferred construction and fabricated in accordance with a preferred process of the present invention, is shown. The inductive component 10 is built up from a shallow, concave depression or "trench" (described below) formed on the surface of a substrate 12, which may be of any material suitable for high-volume manufacturing, with silicon being preferred. The inductive component 10 includes an elongate ferromagnetic core 14 having an axis that is substantially parallel to the plane of the substrate 12. The core 14 is surrounded by a spiral or helical conductive winding or coil formed from a first or lower array of spaced apart, substantially parallel, lower conductive elements 16 and a second or upper array of similarly spaced apart, substantially parallel, upper conductive elements 18. Each lower conductive element 16 is formed as a length of conductive metal, such as copper, and has a first end 20 and a second end 22. Similarly, each upper conductive element 18 comprises a length of conductive metal, again such as copper, with a first end 24, and a second end 26. The upper conductive elements 18 are arranged at an acute angle with respect to the lower conductive elements 16. The first end 24 of each of the upper conductive elements 18 contacts the first end 20 of one of the lower conductive elements 16. The second end 26 of each of the upper conductive elements 18 contacts a second end 22 of the next successive lower conductive element 16, so that together the upper and lower conductive elements form the continuous spiral conductive winding surrounding the core 14.

A first core insulation layer 28 separates the core 14 from the lower conductive elements 16. A second core insulation layer 30 separates the core 14 from the upper conductive elements 18. In addition, a lower insulation layer 32 electrically and magnetically isolates the inductive component 10 from the substrate 12. The lower insulation layer 32, which is formed with a shallow depression or "trench" 34 (as described below), reduces inductive coupling from the coil to the substrate 12 and thus to other components (not shown) that may be located nearby on the substrate 12. The entire inductive component 10 is preferably encapsulated in a passivation layer 54 of insulating polymeric material for protection from the environment.

A preferred method of manufacturing or fabricating the inductive component 10 of FIGS. 13, 14, and 15 in accordance with the present invention will now be described with reference to FIGS. 1 through 13.

FIGS. 1, 2, and 3 show the preparation of the substrate 12 for receiving the metal that forms the array of lower conductive elements 16 (FIGS. 4A, 4B) of the inductor coil. This portion of the process includes forming the layers that provide magnetic and electrical isolation of the inductive component from the substrate 12.

Referring first to FIG. 1, the substrate 12 initially has a planar upper surface. The substrate 12 may be a resistive semiconductor substrate of lightly doped silicon, or it may be formed of other substrate materials commonly used in the microelectronics industry, such as gallium arsenide, indium phosphide, FR4, and ceramic.

An insulative base layer 42, of a photosensitive, insulative, polymeric material having a low dielectric constant, is formed on the surface of the substrate 12 to permit formation of an isolation trench 34 (FIG. 3). A preferred material is benzocyclobutene (BCB), which is commercially available, for example, from Dow Chemical Co. under the tradename "CYCLOTENE". The base layer 42 is spun on the substrate surface to a thickness of about 10 microns to about 30 microns. The base layer 42 is masked for photo-etching, exposed, and developed so as to create an opening 44 where the isolation trench 34 is to be formed (FIG. 2). After the base layer 42, with the opening 44, is cured (preferably by a "soft" cure technique), a second BCB layer is spun on top of the base layer 42 so as to form the lower insulation layer 32 that substantially fills the opening 44, while leaving a shallow concavity or depression (of at least about 2 microns, and preferably about 5 to 10 microns maximum depth) that defines the trench 34, as shown in FIG. 3. The lower insulation layer 32 is then cured, preferably by a "hard" (high temperature) cure technique.

The concave configuration of the trench 34 allows the use of a thicker core 14 than would be possible on a flat surface using prior art via-less architecture techniques. In addition, the trench 34 allows the overall height of the final inductive component to be less than what it would be if it were constructed on a flat surface, while also allowing the use of a thicker lower insulation layer 32 for a given vertical profile for the finished component.

The insulating material of the lower insulation layer 32 may also be polyimide. BCB is preferred, however, because it is relatively hydrophobic and thus reduces the problem of moisture absorption during fabrication, which could result in unacceptable variations in the insulative qualities of the material.

An alternative method of creating the trench 34 is to coat the upper surface of the substrate with a thin (not more than about one micron) masking layer of silicon dioxide or silicon nitride by means such as vacuum deposition or plasma-enhanced chemical vapor deposition. The masking layer is patterned using standard photolithographic masking techniques, coupled with plasma etching. A trench is then formed in the substrate 12 itself by means such as plasma, solvent, or caustic etching. A layer of polyimide or (preferably) BCB is then applied (as by spinning) to partially fill the trench 34, forming the lower insulation layer 32 having a shallow depression, as described above. Alternatively, photosensitive BCB may be used to mask the substrate for a caustic etching step.

The trench 34, filled with the lower insulation layer 32, provides magnetic isolation that reduces the degree of magnetic flux coupling with the somewhat conductive silicon substrate 12. Limiting this coupling reduces magnetic losses and cross-talk with any underlying signal routing and with other active components (not shown) that may be located on the same substrate. To achieve a suitable degree of isolation, the minimum thickness of the lower insulation layer 32 should be at least about 10 microns, and preferably about 20 microns.

Figure 21:
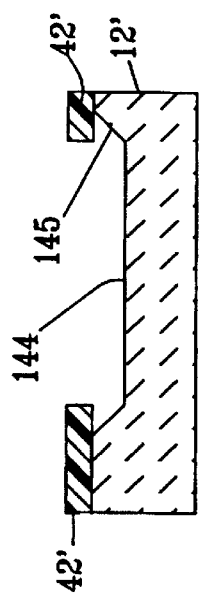
FIGS. 20–22 are lateral cross-sectional views of a portion of an inductive component constructed in accordance with a second embodiment of the present invention, showing the first three major successive steps of the fabrication process for such a component.
Figure 22:
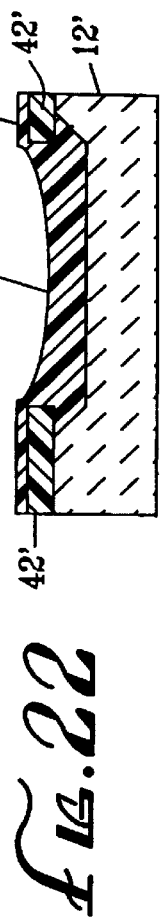
Figure 20:
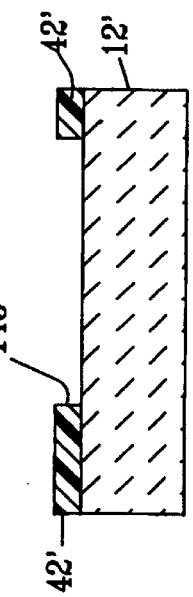

An alternative embodiment of the process for forming the trench 34, and resulting structure is illustrated in FIGS. 20–22. This alternative embodiment is particularly suited for use with a crystalline substrate such as silicon.

Referring first to FIG. 20, a substrate 12' is provided, having a planar surface. The substrate 12' is preferably made of lightly doped virgin silicon, such as <100> p-type silicon of greater than 2000 Ω-cm. The planar upper surface of the substrate 12' is coated with a thin (not more than about one micron) hard masking layer 42' of silicon dioxide or silicon nitride. The masking layer 42' may be applied by vacuum deposition or plasma-enhanced chemical vapor deposition. In yet a further variation, photosensitive BCB may be applied as the masking layer 42', using conventional spin-on techniques.

The masking layer 42' is patterned, using conventional techniques appropriate for the hard mask material, to expose an area for a trough (144 in FIG. 21) to be formed in the substrate. An opening 143 is formed through the undeveloped portion of the masking layer 42' over where the trough 144 is to be etched into the substrate 12'.

Referring to FIG. 21, the trough 144 is etched into the substrate 12' by means such as plasma etching. A potassium hydroxide (KOH) timed etch for the <111> slope of the substrate crystal structure (54.7°) may be used, resulting in trough sides 145 sloped at 54.7°. The crystalline structure of the substrate 12' ensures a high degree of repeatability for the etch process, so that the trough 144 always has the same shape. As will be understood by those skilled in semiconductor manufacturing, a certain amount of the substrate 12' beneath the edges of the mask layer 42' will be undercut during the etching process.

Referring next to FIG. 22, the trough 144 is partially filled in with a polymeric insulation material, preferably BCB, to form a lower insulation layer 132, having a concavity in its top surface that forms a depression or trench 34'. The lower insulation layer 132 provides magnetic isolation that reduces the degree of magnetic flux coupling with the somewhat conductive silicon substrate 12'. The trench 34', like the trench 34 of the previously-described embodiment, allows a thicker core to be formed than would otherwise be feasible on a flat substrate using a via-less architecture. The trench 34' also allows the overall height of the final inductive component to be reduced over what it would be if it were constructed on a flat surface, while allowing a suitable thickness (i.e., at least about 10 microns, and preferably about 20 microns) for the lower insulation layer 132 to be obtained.

The BCB material that forms the lower insulation layer 132 may be applied to the surface of the substrate 12' and cured, by conventional techniques, to form a layer of BCB over the surface of the substrate 12'. Sufficient material is applied substantially to fill the trough 144, while leaving the trench 34' in the top surface of the material in the trough 144.

The depression or trench 34' in the top surface of the lower insulation layer 132 filling the trough 144 in the substrate 12' (FIG. 22) is equivalent to the depression or trench 34 in the top surface of the insulation layer 32 applied on top of the planar surface of the substrate 12 (FIG. 3). Thus, whichever of the above-described processes is used to provide the concave lower insulation layer, the remaining steps of the manufacturing process are the same and are as described below in connection with FIGS. 4A–13. For exemplary purposes only, the terminology used henceforth shall be that employed in connection with the above description of FIGS. 1–3.

Referring to FIGS. 4A and 4B, an array of lower conductive elements 16 is patterned on top of the lower insulation layer 32. The lower conductive elements 16 conform to the depression 34 in the upper surface of the lower insulation layer 32, extending over the sides of the isolation trench 34 to form the first and second conductive element ends 20, 22. The array of lower conductive elements 16 forms the lower portion of the winding or coil of the inductive component.

The lower conductive elements 16 are deposited so as to be parallel to one another, and may be at an angle with respect to the longitudinal axis of the substrate 12.

The lower conductive elements 16 need to have a low resistance, with a high immunity to electromigration. To achieve these ends, copper is the preferred material for the lower conductive elements 16. The copper is preferably electroplated or electro-less plated, but it may also be vacuum-deposited by sputtering, chemical vapor deposition, or evaporation. Other conductive metals, such as aluminum, may be used for low current applications. The thickness of the lower conductive elements 16 (and of the upper conductive elements 18, as described below) will depend on the desired current capacity of the inductive component. A thickness of at least about 2 microns is preferred for minimum line resistance, thereby increasing the current carrying capacity of the conductive elements 16, 18, and therefore improving their power handling characteristics.

The lower conductive elements 16 follow the curved contour of the lower insulation layer 32, and they have a substantially uniform thickness. Thus, the lower conductive elements 16 also have a concave upper surface. The curved shape of the conductive elements 16 reduces or eliminates sharp corners in the winding of the finished inductive component, reducing current crowding in the coil formed by the conductive elements 16, 18.

The lower conductive elements 16 may be applied in the appropriate pattern on the surface of the lower insulation layer 32 by using conventional photolithographic processes. In particular, a lift-off technique similar to that used in the semiconductor manufacturing industry may be used. A lift-off technique includes the steps of applying a photoresist mask layer (not shown) over the lower insulation layer 32. The photoresist is exposed and developed in the desired pattern. For example, the mask layer may be a photoresist layer having a thickness of about 5 to 20 microns applied on top of the lower insulation layer 32. The photoresist is exposed in the pattern for the lower conductive elements 16, and optimized for a vertical or retrograde profile. The exposed photoresist is removed, leaving openings (not shown) through the photoresist to the surface of the lower insulation layer 32. The metal is deposited over the entire surface of the lower insolation layer 32, using unidirectional physical vapor deposition (PVD) techniques, thereby being deposited through the openings in the photoresist onto the surface of the lower insulation layer 32.

At the transitions between where the photoresist covers the lower insulation layer 32, and where the surface of the lower insulation layer 32 is exposed through the openings in the photoresist, the metal deposition on the vertical walls of the photoresist tends not to be continuous. Therefore, after the metal has been deposited, the entire device may immersed in a resist strip solution or solvent. The resist strip solution or solvent is absorbed into the photoresist, which soaks and swells the photoresist. As the photoresist under the undesired metal swells, it fractures the metal coating at the point at which the metal, the photoresist, and the lower insulation layer 32 meet. This fracturing of the metal allows the metal that is not in the patterned photoresist openings to be rinsed away. The metal that is in contact with the lower insulation layer 32 remains, forming the lower conductive elements 16. An ultrasonic strip and filter operation may be used to remove the residual metal fragments and particles that were on top of the photoresist. Such stripping techniques are well-known in the art of semiconductor manufacturing.

An argon pre-sputter step may be performed before the metal is deposited. The pre-sputter cleans and roughens the surface of the lower insulation layer 32 where the metal is to be deposited. In certain processes, especially where copper is used for the lower conductive elements 16, it may be desirable to sputter deposit a tantalum or titanium "glue" layer (not shown) of approximately 200 angstroms after the surface of the lower insulation layer 32 has been cleaned and roughened. The chemically active "glue" layer may aid the copper in adhering to the surface of the BCB material of the lower insulation layer 32. In addition, the titanium or tantalum forms a cladding for the bottom surfaces of the lower conductive elements 16 that helps reduce corrosion or migration of the copper.

In certain instances it may be desirable to apply a second thin inert metal cladding (not shown) on top of the copper, after the copper has been deposited. The cladding, which may be sputter deposited or plated, may help to protect the copper conductor 60 in subsequent processing, and to improve reliability during use.

Using a PVD/lift-off process or a copper electroplating patterning process for the lower conductive elements 16 provides cost and manufacturability advantages over vacuum etch patterning techniques. The above technique also provides an array of lower conductive elements 16 that have a uniform cross-section and that conform precisely to the channel in the photoresist.

It will be recognized that other techniques for depositing the metal that is to form the lower conduct elements 16 may also be used. Other metal deposition techniques may include chemical vapor deposition (CVD) and electroless deposition. Such techniques for depositing metal are well understood in the semiconductor manufacturing arts.

Other techniques may also be used to pattern the lower conductive elements 16. One such technique is wet etching. During wet etching, the metal is blanket deposited across the surface of the isolation layer 32. The deposition step is followed by patterning, which is followed by immersion in a solution that will attack the exposed copper in an isotropic fashion. Recently, dry (plasma) etching for copper has become commercially practical, and may prove to be adaptable for use in the present invention.

The preferred technique for depositing the copper for the lower conductive elements 16 is electroplating. In electroplating, the surface of the lower insulation layer 32 is first seeded with a seed layer (not shown) of electroless copper, or of titanium/copper. The seed layer may also be deposited by vacuum deposition, or by conformal CVD techniques. The surface of the lower insulation layer 32 is then resist-masked everywhere except the locations where the lower conductive elements 16 are to be formed. The substrate is then immersed in a solution of copper ions formed by the dissolution of copper salts such as copper nitrate or copper sulfate. While the substrate is in the copper ion solution, a DC bias is applied to attract the copper ions to the surface to which the copper is to be deposited. Electron exchange results in the precipitation of metal at the surface. In electroplating in this fashion, it is important to maintain precise and uniform control of the electric field around the substrate 12, which is a function of the substrate geometry and the geometry of the plating bath and the electrodes.

Another method of depositing copper is electroless plating. In electroless plating, a copper solution is catalytically activated to induce spontaneous precipitation of the copper ions onto the surface of the lower insulation layer 32.

Yet another procedure for depositing the copper to form the lower conductive elements 16 is damascene processing.

This technique may be preferred for creating a monolithic integration with a standard IC or with an IC back-end process. In damascene processing, a dielectric (not shown) is applied to the surface of the lower insulation layer 32, and trenches are etched into the surface of the dielectric. The trenches are then back-filled with copper, such as by blanket electroplating or by physical vapor deposition (PVD). The surface of the lower insulation layer 32 is then mechanically polished to remove all copper from the flat portions, leaving the copper-filled trenches. This technique makes the formation of the lower conductive elements 16 compatible with standard microelectronic (e.g., Application Specific Integrated Circuit, or "ASIC") processing, and obviates the need for a separate trench-forming step, as described above.

Referring now to FIGS. 5A and 5B, a first core insulation layer 28, preferably of BCB, is applied over the array of lower conductive elements 16. The first core insulation layer 28 insulates the lower conductive elements 16 from the magnetic core 14 (to be formed later in the process, as described below). The BCB forming the first core insulation layer 28 may be applied by a spin-on technique so as to cover the lower conductive elements 16. Ideally, the formulation of the first core insulation layer 28 leaves it with a concavity on its upper surface that provides a "bed" for the core. The target thickness of the first core insulation layer 28 is determined by the desired performance characteristics of the inductive component 10. For example, with a relatively thin first core insulation layer 28, the response of the inductive component 10 tends to be better, due to more efficient coupling of the magnetic field to the core 14. On the other hand, a thicker first core insulation layer 28 provides better breakdown strength for high voltage applications.

After it is deposited, the BCB of the first core insulation layer 28 is soft baked at about 55° C., then exposed and developed, and then cured. Again, the processes for exposing, developing, and curing the BCB are well understood in the semiconductor arts. Curing the BCB keeps it from dissolving with the photoresist when the photoresist is dissolved, and stabilizes it for later processing. In some applications, a partial cure of the BCB will provide adequate performance for the finished inductive component. In other circumstances, it may be necessary to cure each layer of the BCB completely.

Any of several materials may be used to form the magnetic core 14 of the inductive component. In a preferred embodiment, an alloy of about 80% nickel and about 20% iron is used as the core material. Optionally, small amounts of molybdenum and/or chromium may be added for increased permeability, with the nickel and iron percentages proportionally reduced. A suitable nickel/iron alloy is marketed under the trademark PERMALLOY®. The core 14, which is preferably built up by electroplating (or, alternatively, by sputtering), is formed over the central portion of each of the lower conductive elements 16, so that the conductive element ends 20, 22 remain exposed along the sides of the core 14.

Figure 6:
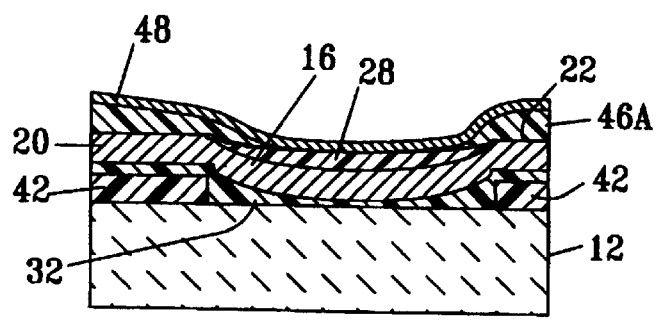
Figure 7:
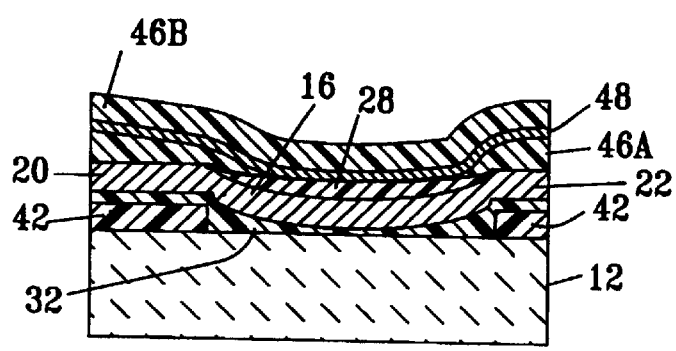
Figure 8:
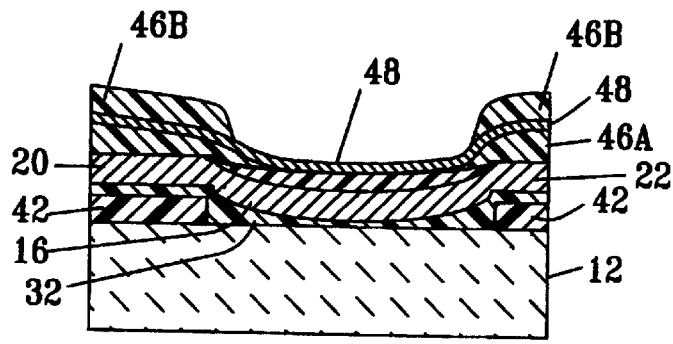

FIGS. 6 through 8 show the novel preparation of the surface of the first core insulation layer 28 for creating the magnetic core 14. First and second photoresist layers 46a, 46b are applied with a thin metallic seed layer 48, preferably of titanium/copper or titanium/nickel, between them. Each of the photoresist layers 46a, 46b is exposed and developed to form a core mask. Exposing and developing the photoresist forms a depression in the surface of the structure. The seed layer 48 from which the core 14 may be grown is exposed. The first photoresist layer 46a protects the underlying layers and beds the seed layer 48. The second photoresist layer 46b covers the seed layer 48 everywhere except where the core 14 is to be formed; it thus forms a "micromold" in which the core is grown and formed.

Referring particularly to FIG. 6, the first or lower photoresist layer 46a is applied over the lower conductive elements 16, with an opening over the first core insulation layer 28. The area of the first photoresist layer 46a over the first core insulation layer 28 may be exposed and developed to remove the photoresist material over the first core insulation layer 28 to form the opening through which the first core insulation layer 28 is exposed. With this opening in the first photoresist layer 46a, the upper surface of the structure thus far developed has a depression over the lower insulation layer 32. The edges of the opening in the first photoresist layer 46a are sloped or curved to provide a gradual change between the surface levels, thereby facilitating the creation of an electrically continuous seed layer 48.

The surface of the first photoresist layer 46a and the exposed surface of the first core insulation layer 28 may be prepared for the application of the seed layer 48 by using an argon presputter. The seed layer 48 is then applied over the first photoresist layer 46a. The metal of the seed layer 48 may be sputter-deposited on the surface of the first photoresist layer 46a and the exposed portion of the first core insulation layer 28. The seed layer 48, which preferably has a thickness of about 500 to about 1,000 Angstroms, forms the bed for the development of the inductor core 14, as will be described below.

Referring now to FIG. 7, the second or upper photoresist layer 46b is applied over the seed layer 48. The photoresist material of the second photoresist layer 46b is exposed in the area that overlies the lower insulation layer 32, and it is developed to produce an opening through the second photoresist layer 46b, thus exposing the central portion of the seed layer 48, as shown in FIG. 8.

Figure 9:
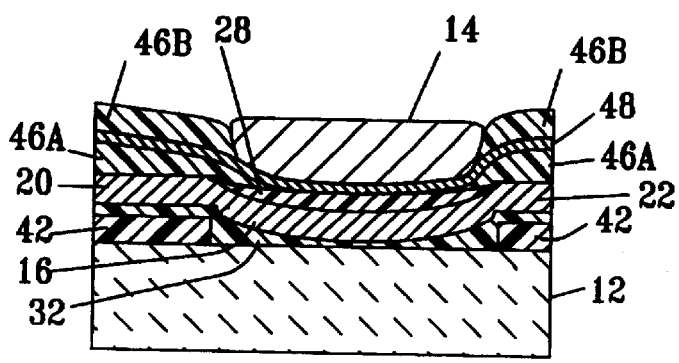

The ferromagnetic inductor core 14 is grown from the seed layer 48, as seen in FIG. 9. The core 14 is preferably formed by electroplating the core material. The core 14 is built up so as to fill and substantially conform to the opening in the second photoresist layer 46b (a process known as "micromolding"). The size of the core 14 is determined by the length of time that the core 14 is allowed to grow from the seed layer 48 during the electrochemical deposition process. Ideally, the core 14 is allowed to grow to point which the top of the core 14 is approximately level with the top surface of the second photoresist layer 46b. Such a size and shape will provide a substantially symmetrical construction for the conductor windings about the core 14. The size and configuration of the core 14 may be varied, however, depending on the desired electrical performance of the inductive component. In a typical example, the core 14 may be about 0.5 to about 25 microns thick.

A novel variation of the lift-off techniques used in semiconductor manufacturing may be used to remove the photoresist layers 46a, 46b and the seed layer 48 without placing acids in contact with other structures of the device. Specifically, the substrate is immersed in a bath of photoresist strip fluid, such as acetone, to remove the second photoresist layer 46b. Then, ultrasonic waves are introduced into the acetone bath, as is well-known in the art, to crack the metallic seed layer 48. The photoresist material forming the layers 46a, 46b absorbs the acetone photoresist strip fluid. As the photoresist material absorbs the acetone, the photoresist material swells, and cracks the thin seed layer 48, allowing the photoresist strip fluid to dissolve the first or lower photoresist layer 46a that is underneath the seed layer 48. The photoresist strip fluid then dissolves away the photoresist layers 46a, 46b, and the seed layer 48 is detached from the substrate, broken into a number of small pieces or particles. The surface of the substrate is rinsed after the stripping step to remove particles of seed layer metal. This rinsing may be performed using an ultrasonic strip and filtering process. This method avoids the pitfalls of a subtractive chemical etching process, namely, an aggressive, unwanted attack on the other materials in the inductive component.

FIGS. 10, 11A, and 11B illustrate the steps of preparing the core 14 to receive a second layer of conductive metal that will form the upper half of each winding of the inductor. Referring first to FIG. 10, the photoresist layers 46a, 46b are removed to leave the core 14, as discussed above, with possibly a small undercut 50 on each side. Likewise, all of the seed layer 48, except for that portion directly underlying the core 14, is removed.

Referring next to FIGS. 11A and 11B, the second core insulation layer 30, also preferably of BCB, is applied over the core 14. As explained above with reference to FIGS. 14 and 15, the second core insulation layer 30 lies between the core 14 and the array of upper conductive elements 18 that forms the upper portion of the winding or coil for the inductive component 10. The second core insulation layer 30 is preferably a thin layer of BCB applied over the core 14 by conventional spin-on techniques. When so applied, the fluid BCB material fills in any undercuts 50 under the edges of the seed layer 48. The BCB of the second core insulation layer 30 may be soft-baked at 55° C., and then exposed, developed, and cured. In some instances, a full cure will be necessary to protect the BCB material during subsequent processing. In particular, the BCB material should be cured sufficiently that it does not dissolve, and is not otherwise damaged during subsequent processing. In other circumstances, a partial cure of the BCB may be sufficient. In yet other circumstances, a cure may not be necessary.

Referring next to FIGS. 12A and 12B, an array of upper conductive elements 18 (only one of which is shown in the drawing) is patterned on top of the second core insulation layer 30. Like the lower conductive elements 16, the upper conductive elements 18 are preferably formed of electroplated or electroless plated copper, although other techniques, well-known in the art, may also be used. In any case, the upper and lower conductive elements 18, 16 are preferably formed of the same metal. The array of upper conductive elements 18 forms the upper half of the inductive windings or coil for the inductive component. Each of the upper conductive elements 18 contacts two adjacent lower conductive elements 16 to provide a helical conductive path all the way around the core 14. Specifically, each of the upper conductive elements 18 comprises a substantially straight length of conductive metal, such as copper, having a first end 24, and a second end 26 (as described above with reference to FIGS. 14 and 15). The upper conductive elements 18 are arranged substantially parallel to one another, at an acute angle with respect to the lower conductive elements 16. The first end 24 of each upper conductive element 18 contacts the first end 20 of one of the lower conductive elements 16. The second end 26 of each upper conductive element 18 contacts a second end 22 of an adjacent lower conductive element 16, so that together the upper and lower conductive elements 16, 18 form the spiral or helical conductive winding surrounding the core 14, as shown in FIGS. 12A, 14, and 15, analogous to a coiled spring wrapped around a rod or pole. A horizontal extension 52 of the first end 24 of each of the upper conductive elements 18 provides routing metallization between the windings of the inductive component and bond pads or other electrical connections (not shown) that may be formed on the same substrate.

An inductive component 10 in accordance with the present invention may have a virtually unlimited number of turns in the coil formed by the lower and upper conductive elements 16, 18. In typical applications, the inductive component 10 has a length between about 100 microns and about 5 mm. Such an inductive component may have an inductance of at least microhenries in order of magnitude.

A final insulative passivation layer 54, preferably of BCB, is applied over the entire structure, and in particular over the upper conductive elements 18, as shown in FIGS. 13, 14, and 15. The passivation layer 54 is preferably applied by a conventional spin-on technique. Furthermore, it is preferably patterned with a "pad mask" (not shown) and exposed so as to form bond pad openings (vias) through the passivation layer 54 to provide access to bond pads (not shown) that are connected to the extensions 52 of the upper conductive elements 18. The passivation layer 54 is then developed and cured. The cure may comprise a full cure at about 300° C in a gaseous nitrogen ambient environment ( not more than about 100 ppm $O_2$).

Figure 17:
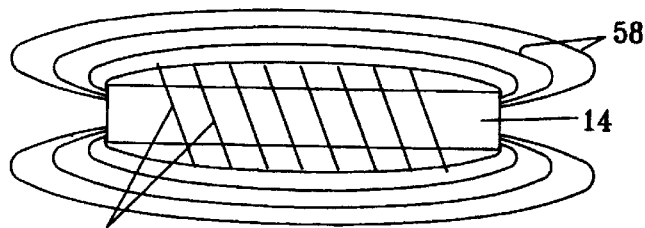
FIG. 17 is a schematic illustration of magnetic field lines generated by an inductive component configured as a solenoid with a ferromagnetic core.

One of the issues that may arise in certain applications is electromagnetic compatibility, which relates to uncontained field lines outside the core of the inductive component. This issue is illustrated schematically in FIG. 17, which shows the core 14 surrounded by several inductor windings 56, along with the resulting magnetic flux lines 58 above and below the core 14. The magnetic field represented by the unconstrained magnetic flux lines 58 may undesirably couple to the substrate upon which the inductive component is formed. In addition, such stray field lines can interact with other devices or metal conductors or routings in the vicinity of the inductive component. Such undesired interaction may degrade the performance of adjacent components, or impair the signal quality in any adjacent conductor. At the very least, these uncontained field lines represent degenerative losses of the efficiency (Q factor) of the inductive component 10.

Figure 18:
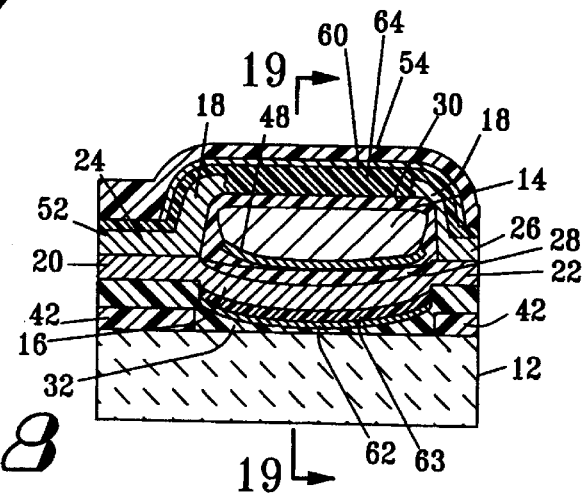
FIG. 18 is a lateral cross-sectional view of a modification of the present invention that includes magnetic shielding.
Figure 19:
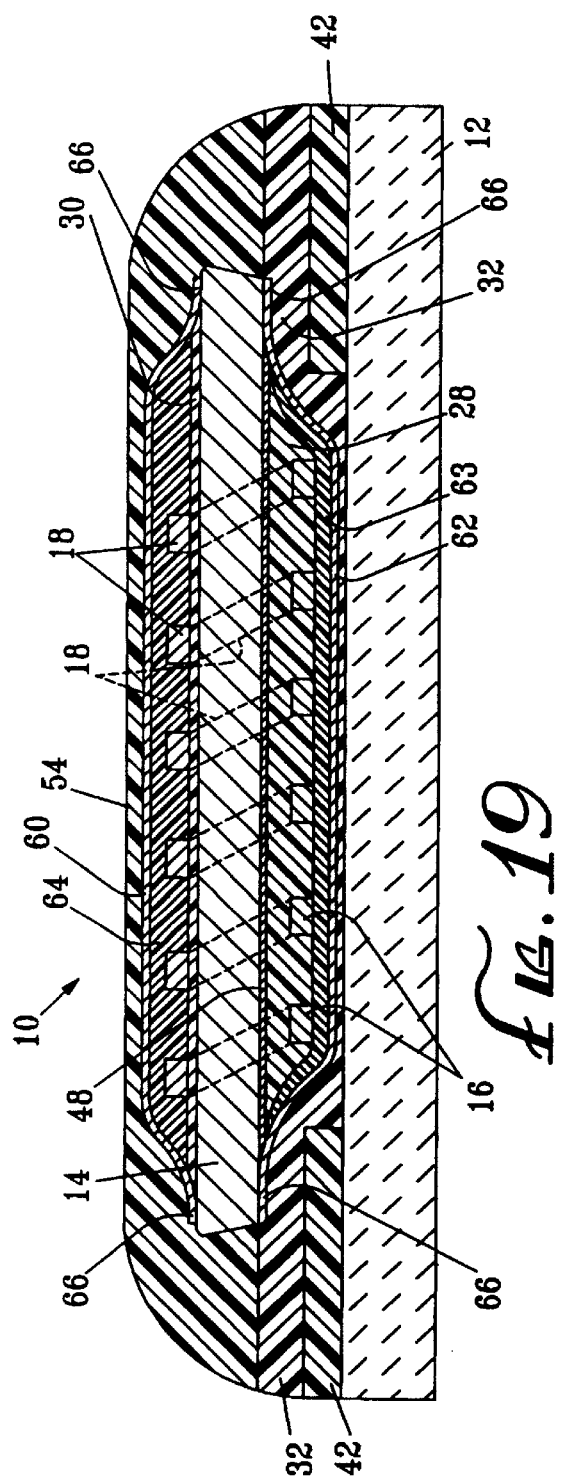
FIG. 19 is a longitudinal cross-sectional view taken along line 19—19 of FIG. 18.

In applications where the containment of the magnetic field generated by the inductive component is desired, an upper ferromagnetic shield layer 60 and/or a lower ferromagnetic shield layer 62 may be formed to provide magnetic shielding above and/or below the inductive component, as shown in FIGS. 18 and 19. Preferably, the lower shield layer 62 is formed by patterning and electroplating a ferromagnetic metal layer on top of the lower insulation layer 32. A lower shield insulation layer 63, preferably of BCB, is then formed on top of the lower shield layer 62. Similarly, an upper shield insulation layer 64, preferably of BCB, is formed over the upper array of conductive elements 18, and then the upper shield layer 60 is formed by patterning and electroplating a ferromagnetic metal layer on top of the upper shield insulation layer 64.

As shown in FIG. 19, the upper and lower shield layers 60, 62 and the intervening insulation layers are configured so that each of the shield layers has a pair of opposed end portions 66 that are in contact with corresponding end portions of the core 14. The resulting magnetic shield channels the external flux lines and re-directs them back to the core 14, thereby enhancing inductive efficiency by improving the use of the magnetic energy, while minimizing inductive coupling to adjacent devices and/or conductors. In some applications, the lower ferromagnetic shield layer 62 may be sufficient, and the upper ferromagnetic shield layer 60 may be omitted, or vice versa.

FIG. 16 shows a cross-section of an inductive component 70 in accordance with a second embodiment of the present invention. This embodiment is advantageous for high frequency applications (i.e., in the megahertz range) that require a core with a low permeability, e.g., approximately that of air. As shown in FIG. 16, the inductive component 70 is formed on a substrate 72 that does not have conductive properties, such as, for example, pressed ceramic, FR4, or Teflon. A base insulation layer 73 of a low magnetic coupling polymer material, preferably BCB, is laid down on the surface of the substrate 72, preferably by a spin-on or spray-on technique, and it is masked for photo-etching, exposed, and developed, in a conventional manner, to provide an opening that is partially filled by a lower insulation layer 74, also preferably of spun-on BCB, as described above with reference to FIGS. 1, 2, and 3. Thus, as described above, the lower insulation layer 74 is formed with a shallow concavity or trench. The lower insulation layer 74 has a minimum thickness sufficient to provide magnetic and electrical isolation between the inductive component 70 and the substrate 72. For these purposes, a minimum thickness of at least about 10 microns, and preferably at least about 20 microns, is desired.

The subsequent steps of forming the inductive component 70 are substantially the same as those described above in connection with FIGS. 4 through 13, except for the steps relating to the formation of the magnetic core. Briefly, an array of lower conductive elements 76 (only one of which is shown) is patterned in the trench of the lower insulation layer 74. The lower conductive elements 76 are formed from the materials and applied in the manner described above to form the lower portion of the inductor coil.

A first polymeric core layer 78 is then deposited, partially covering the lower conductive elements 76. A second polymeric core layer 80, of similar material, is then deposited on top of the first polymeric layer 78. Alternatively, a single thick polymeric layer may be employed in place of the two relatively thin layers 78, 80. Polyimide and (preferably) BCB are appropriate materials for the polymeric core layers 78, 80 when the component 70 is for use in high frequency applications, because these materials have permeabilities close to that of air, yielding functional characteristics near those of an air core inductive component. Polyimide and BCB, with dielectric constants lower than that of stoichiometric silicon dioxide, are particularly well-suited for the layers 78, 80, being photosensitive to allow direct patterning with minimal concern for delamination or thermal expansion mismatch with other polymeric layers used in the component. Other suitable materials for the polymeric core layers 78, 80 would combine low permeability, low dielectric constant, ease of deposition and patterning, and thermal and chemical compatibility with the other materials in the inductive component 10.

An array of upper conductive elements 82 (only one of which is shown) is then patterned over the second polymeric core layer 80 so that each of the upper conductive elements 82 overlaps and contacts the two adjacent lower conductive elements 76 so as to form a continuous inductive coil, as described above with respect to the first embodiment. As in the first embodiment, the conductive elements 76, 82 are preferably electroplated, or electro-less plated copper, with a titanium or titanium/copper coating (not shown) optionally applied by sputter deposition to protect the copper from corrosion. A passivation layer (not shown) may also be provided to encapsulate the device.

A major advantage of the fabrication process described above is its compatibility with standard, back-end IC processing techniques, due to the capability of forming the lower conductive elements 16 in the same metallization step as the metallized portions of a standard IC. For example, in a molded package IC device, the final layer of the routing metallization can be formed simultaneously with the lower conductive elements of the inductive device 10. Similarly, in a "flip-chip" package configuration, the redistribution metallizations and the lower conductive elements 16 of the inductive device 10 can be formed in the same step.

While a preferred embodiment and several alternative embodiments of the invention have been described herein, it will be appreciated that a number of variations and modifications will suggest themselves to those skilled in the pertinent arts. Such variations and modifications should be considered within the spirit and scope of the invention, as defined in the claims that follow.

What is claimed is:

1. An inductive component formed on a substrate, comprising:
   a lower insulation layer formed on a surface of the substrate, the lower insulation layer having a concave depression and formed of a material consisting essentially of benzocyclobutene;
   a first array of conductive elements formed in the depression, each of the first array of conductive elements having first and second ends;
   a core insulation layer formed over the first array of conductive elements so as to leave the first and second ends thereof exposed and formed of a material consisting essentially of benzocyclobutene; and
   a second array of conductive elements formed over the core insulation layer, each of the second array of conductive elements having first and second ends, wherein the second array of conductive elements is formed so that the first and second ends of the conductive elements in the second array are respectively connected to the first and second ends of the conductive elements in the first array so as to form an inductive coil.

2. The inductive component of claim 1, wherein the core insulation layer is a first core insulation layer, the component further comprising:
   a ferromagnetic core formed on the first core insulation layer; and
   a second core insulation layer formed over the ferromagnetic core;
   wherein the second array of conductive elements is formed over the second core insulation layer.

3. The inductive component of claim 2, further comprising:
   a ferromagnetic shield layer disposed with respect to at least one of the arrays of conductive elements so as to contain the magnetic field generated by the inductive component.

4. The inductive component of claim 3, wherein the ferromagnetic shield layer comprises:
   a lower ferromagnetic shield layer disposed between the lower insulation layer and the first array of conductive elements.

5. The inductive component of claim 4, further comprising:
   a lower shield insulation layer disposed between the lower ferromagnetic shield layer and the first array of conductive elements.

6. The inductive component of claim 3, wherein the ferromagnetic shield layer comprises:
   an upper ferromagnetic shield layer formed over the second array of conductive elements.

7. The inductive component of claim 6, further comprising:
   a lower shield insulation layer disposed between the upper ferromagnetic shield layer and the second array of conductive elements.

8. The inductive component of any of claims 2, 3, 4, 5, 6, or 7, wherein the lower insulation layer, the first core insulation layer, and the second core insulation layer are formed from a material consisting essentially of benzocyclobutene.

9. The inductive component of claim 5, wherein the lower shield insulation layer is formed from a material consisting essentially of benzocyclobutene.

10. The inductive component of claim 7, wherein the upper shield insulation layer is formed from a material consisting essentially of benzocyclobutene.

11. An inductive component formed on a substrate, comprising:
   a lower insulation layer formed on a surface of the substrate, the lower insulation layer having a concave depression;
   a first array of conductive elements formed in the depression, each of the first array of conductive elements having first and second ends;
   a first core insulation layer formed over the first array of conductive elements so as to leave the first and second ends thereof exposed;
   a magnetic core formed on the first core insulation layer;
   a second core insulation layer formed over the magnetic core; and
   a second array of conductive elements formed over the second core insulation layer, each of the second array of conductive elements having first and second ends, wherein the second array of conductive elements is formed so that the first and second ends of the conductive elements in the second array are respectively connected to the first and second ends of the conductive elements in the first array so as to form an inductive coil.

12. The inductive component of claim 11, further comprising:
   a magnetic shield layer disposed with respect to at least one of the arrays of conductive elements so as to contain the magnetic field generated by the inductive component.

13. The inductive component of claim 12, wherein the magnetic shield layer comprises:
   a lower magnetic shield layer disposed between the lower insulation layer and the first array of conductive elements.

14. The inductive component of claim 13, further comprising:
   a lower shield insulation layer disposed between the lower magnetic shield layer and the first array of conductive elements.

15. The inductive component of claim 12, wherein the magnetic shield layer comprises:
   an upper magnetic shield layer formed over the second array of conductive elements.

16. The inductive component of claim 15, further comprising:
   a lower shield insulation layer disposed between the upper magnetic shield layer and the second array of conductive elements.

17. The inductive component of any of claims 11, 12, 13, 14, 15, or 16, wherein the lower insulation layer, the first core insulation layer, and the second core insulation layer are formed from a material consisting essentially of benzocyclobutene.

18. The inductive component of claim 14, wherein the lower shield insulation layer is formed from a material consisting essentially of benzocyclobutene .

19. The inductive component of claim 16, wherein the upper shield insulation layer is formed from a material consisting essentially of benzocyclobutene.

* * * * *